(12) United States Patent
Ding et al.

(10) Patent No.: US 11,550,434 B2
(45) Date of Patent: Jan. 10, 2023

(54) SHORT-TERM NOISE SUPPRESSION

(71) Applicant: Synaptics Incorporated, San Jose, CA (US)

(72) Inventors: Cungang Ding, Shanghai (CN); Longming Cheng, Shenzhen (CN); Guanhua Cao, Shanghai (CN)

(73) Assignee: Synaptics Incorporated, San Jose, CA (US)

( * ) Notice: Subject to any disclaimer, the term of this patent is extended or adjusted under 35 U.S.C. 154(b) by 14 days.

(21) Appl. No.: 17/073,625

(22) Filed: Oct. 19, 2020

(65) Prior Publication Data

US 2022/0121298 A1  Apr. 21, 2022

(51) Int. Cl.
*G06F 3/044* (2006.01)
*H03G 3/34* (2006.01)

(52) U.S. Cl.
CPC ............. *G06F 3/044* (2013.01); *H03G 3/344* (2013.01); *H03G 3/345* (2013.01)

(58) Field of Classification Search
CPC ......... G06F 3/044; H03G 3/344; H03G 3/345
See application file for complete search history.

(56) References Cited

U.S. PATENT DOCUMENTS

| | | | |
|---|---|---|---|
| 6,204,649 B1 * | 3/2001 | Roman | H02M 1/12 323/285 |
| 6,266,633 B1 * | 7/2001 | Higgins | G10L 21/0208 704/224 |
| 7,031,886 B1 * | 4/2006 | Hargreaves | G06F 3/0418 702/191 |
| 7,240,252 B1 * | 7/2007 | Fessler | H04B 17/345 714/704 |
| 8,824,288 B2 * | 9/2014 | Gao | H04W 28/0236 370/231 |
| 9,209,802 B1 * | 12/2015 | Maharyta | G06F 3/0446 |
| 9,454,278 B2 * | 9/2016 | Keppel | G06F 3/04182 |
| 9,600,121 B2 * | 3/2017 | Stevenson | G06F 3/04184 |
| 10,627,957 B2 * | 4/2020 | Khazeni | G06F 3/0445 |
| 10,969,904 B2 * | 4/2021 | Jiang | G06F 3/0418 |
| 11,050,435 B1 * | 6/2021 | Poulsen | H03M 3/414 |
| 11,126,304 B2 * | 9/2021 | Yamada | G06F 3/0418 |
| 2003/0210749 A1 * | 11/2003 | Asjadi | H04L 27/2647 375/260 |
| 2004/0064775 A1 * | 4/2004 | Gaskill | H04L 1/1887 714/749 |

(Continued)

*Primary Examiner* — Amy Onyekaba
(74) *Attorney, Agent, or Firm* — Ferguson Braswell Fraser Kubasta LLP

(57) ABSTRACT

A processing system is configured to drive a transmitter electrode with a repetitive multi-burst pattern. The repetitive multi-burst pattern includes a first multitude of bursts of a sensing waveform and a second multitude of bursts of the sensing waveform. The second multitude of bursts is a repetition of the first multitude of bursts. The processing system is further configured to receive, from a receiver electrode, a resulting signal in response to the repetitive multi-burst pattern, and identify, in the resulting signal, a segment least affected by a noise, and that temporally coincides with a burst in the first multitude of bursts or a burst in the second multitude of bursts matching the burst in the first plurality of bursts. The processing system is also configured to decode the resulting signal using the segment.

17 Claims, 7 Drawing Sheets

(56) References Cited

U.S. PATENT DOCUMENTS

| | | | |
|---|---|---|---|
| 2007/0140164 A1* | 6/2007 | Zeng | H04L 1/0065 370/329 |
| 2007/0257890 A1* | 11/2007 | Hotelling | G06F 3/04182 345/173 |
| 2008/0155376 A1* | 6/2008 | Williams | H04L 1/0045 714/760 |
| 2008/0157893 A1* | 7/2008 | Krah | G06F 3/0418 345/174 |
| 2008/0158169 A1* | 7/2008 | O'Connor | G06F 3/0418 345/173 |
| 2008/0309625 A1* | 12/2008 | Krah | G06F 3/0418 345/173 |
| 2008/0309628 A1* | 12/2008 | Krah | G06F 3/0445 345/173 |
| 2009/0029660 A1* | 1/2009 | Cha | H04B 15/005 455/127.1 |
| 2009/0303198 A1* | 12/2009 | Yilmaz | G06F 3/044 345/173 |
| 2010/0085325 A1* | 4/2010 | King-Smith | G06F 3/0383 345/174 |
| 2010/0214259 A1* | 8/2010 | Philipp | G06F 3/044 345/174 |
| 2010/0259434 A1* | 10/2010 | Rud | H03M 1/08 340/584 |
| 2010/0260353 A1* | 10/2010 | Ozawa | H04R 3/04 381/94.3 |
| 2010/0296549 A1* | 11/2010 | Okada | H04B 1/30 375/136 |
| 2011/0061948 A1* | 3/2011 | Krah | G06F 3/041 178/18.01 |
| 2011/0063993 A1* | 3/2011 | Wilson | H04L 27/2647 370/254 |
| 2011/0134076 A1* | 6/2011 | Kida | G06F 3/0412 345/174 |
| 2011/0157077 A1* | 6/2011 | Martin | G06F 3/044 345/174 |
| 2011/0210939 A1* | 9/2011 | Reynolds | G09G 5/18 345/174 |
| 2011/0241651 A1* | 10/2011 | Oda | G06F 3/04182 324/76.39 |
| 2012/0001859 A1* | 1/2012 | Kim | G06F 3/04182 345/173 |
| 2012/0157167 A1* | 6/2012 | Krah | G06F 1/3203 345/173 |
| 2012/0268415 A1* | 10/2012 | Konovalov | G06F 3/0418 345/174 |
| 2013/0057512 A1* | 3/2013 | Lillie | G06F 3/0412 345/174 |
| 2013/0106436 A1* | 5/2013 | Brunet | G06F 3/0443 324/613 |
| 2013/0257765 A1* | 10/2013 | Lee | G06F 3/041 345/173 |
| 2013/0293511 A1* | 11/2013 | Nam | G06F 3/0443 345/174 |
| 2014/0022203 A1* | 1/2014 | Karpin | G01R 29/26 702/65 |
| 2014/0049507 A1* | 2/2014 | Shepelev | G06F 3/04184 345/174 |
| 2014/0198053 A1* | 7/2014 | Yoon | G06F 3/04166 345/173 |
| 2014/0225856 A1* | 8/2014 | Shepelev | G06F 3/046 345/174 |
| 2014/0253032 A1* | 9/2014 | Bruwer | G01R 27/2605 320/108 |
| 2015/0212623 A1* | 7/2015 | Hatano | G06F 3/04186 345/174 |
| 2015/0309658 A1* | 10/2015 | Stevenson | G06F 3/04184 345/176 |
| 2017/0102826 A1* | 4/2017 | Hamaguchi | G06F 3/03545 |
| 2017/0123523 A1* | 5/2017 | Huang | G06F 3/0418 |
| 2018/0046323 A1* | 2/2018 | Yang | G06F 3/0418 |
| 2018/0239493 A1* | 8/2018 | Khazeni | G06F 3/04184 |
| 2018/0267639 A1* | 9/2018 | Han | G06F 3/0418 |
| 2019/0034028 A1* | 1/2019 | Stevenson | G06F 3/04186 |
| 2019/0042056 A1* | 2/2019 | Monson | G06F 3/0383 |
| 2019/0317637 A1* | 10/2019 | Jiang | G06F 3/044 |
| 2020/0089385 A1* | 3/2020 | Han | G06F 3/04182 |
| 2020/0159352 A1* | 5/2020 | Shimada | G06F 3/0416 |
| 2020/0252907 A1* | 8/2020 | Rune | H04W 56/0015 |
| 2020/0336241 A1* | 10/2020 | Kilian | H04L 1/0003 |
| 2021/0185652 A1* | 6/2021 | Rune | H04L 5/0053 |
| 2021/0191562 A1* | 6/2021 | Han | G06F 3/04182 |
| 2021/0314910 A1* | 10/2021 | Rune | H04L 27/2607 |
| 2021/0326024 A1* | 10/2021 | Jun | G06F 3/04184 |

* cited by examiner

| Example Noise Emission Pattern 300 24 Emissions, each for 0.5ms ||
|---|---|
| Frequency (kHz) | Amplitude (V) |
| 471 | 0.1 |
| 452 | 0.1 |
| 434 | 0.1 |
| 416 | 0.1 |
| 398 | 0.1 |
| 380 | 0.1 |
| 362 | 0.1 |
| 344 | 0.05 |
| 326 | 0.05 |
| 308 | 0.1 |
| 290 | 0.1 |
| 272 | 0.1 |
| 254 | 0.2 |
| 236 | 0.2 |
| 218 | 0.2 |
| 200 | 0.2 |
| 182 | 0.2 |
| 164 | 0.2 |
| 136 | 0.2 |
| 118 | 0.2 |
| 100 | 0.1 |
| 72 | 0.1 |
| 62 | 0.1 |
| 56 | 0.1 |

FIG. 3

SHORT-TERM NOISE SUPPRESSION

TECHNICAL FIELD

The described embodiments relate generally to electronic devices, and more specifically, to noise suppression for capacitive imaging sensors.

BACKGROUND

Input devices including proximity sensor devices (e.g., touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

Proximity sensor devices are typically used in combination with other components, such as power supplies or battery chargers. These components may emit noise that may impair the sensing capabilities of the proximity sensor devices.

Therefore, it is desirable to perform a proximity sensing in a manner that is robust to the noise.

SUMMARY

In general, in one aspect, one or more embodiments relate to a processing system configured to: drive a transmitter electrode with a repetitive multi-burst pattern, wherein the repetitive multi-burst pattern comprises: a first plurality of bursts of a sensing waveform, and a second plurality of bursts of the sensing waveform, wherein the second plurality of bursts is a repetition of the first plurality of bursts; receive, from a receiver electrode, a resulting signal in response to the repetitive multi-burst pattern, identify, in the resulting signal, a segment least affected by a noise, and that temporally coincides with a burst in the first plurality of bursts or a burst in the second plurality of bursts matching the burst in the first plurality of bursts; decode the resulting signal using the segment.

In general, in one aspect, one or more embodiments relate to an input device, comprising: a transmitter electrode and a receiver electrode; and a processing system configured to: drive the transmitter electrode with a repetitive multi-burst pattern, wherein the repetitive multi-burst pattern comprises: a first plurality of bursts of a sensing waveform, and a second plurality of bursts of the sensing waveform, wherein the second plurality of bursts is a repetition of the first plurality of bursts; receive, from the receiver electrode, a resulting signal in response to the repetitive multi-burst pattern, identify, in the resulting signal, a segment least affected by noise, and that: temporally coincides with a burst in the first plurality of bursts or a burst in the second plurality of bursts matching the burst in the first plurality of bursts; decode the resulting signal using the segment.

In general, in one aspect, one or more embodiments relate to a method comprising: driving a transmitter electrode with a repetitive multi-burst pattern, wherein the repetitive multi-burst pattern comprises: a first plurality of bursts of a sensing waveform, and a second plurality of bursts of the sensing waveform, wherein the second plurality of bursts is a repetition of the first plurality of bursts; receiving, from a receiver electrode, a resulting signal in response to the repetitive multi-burst pattern, identifying, in the resulting signal, a segment least affected by a noise, and that temporally coincides with a burst in the first plurality of bursts or a burst in the second plurality of bursts matching the burst in the first plurality of bursts; decoding the resulting signal using the segment.

Other aspects of the embodiments will be apparent from the following description and the appended claims.

BRIEF DESCRIPTION OF DRAWINGS

FIG. 3 shows a noise emission pattern, in accordance with one or more embodiments.

DETAILED DESCRIPTION

Figure 1:
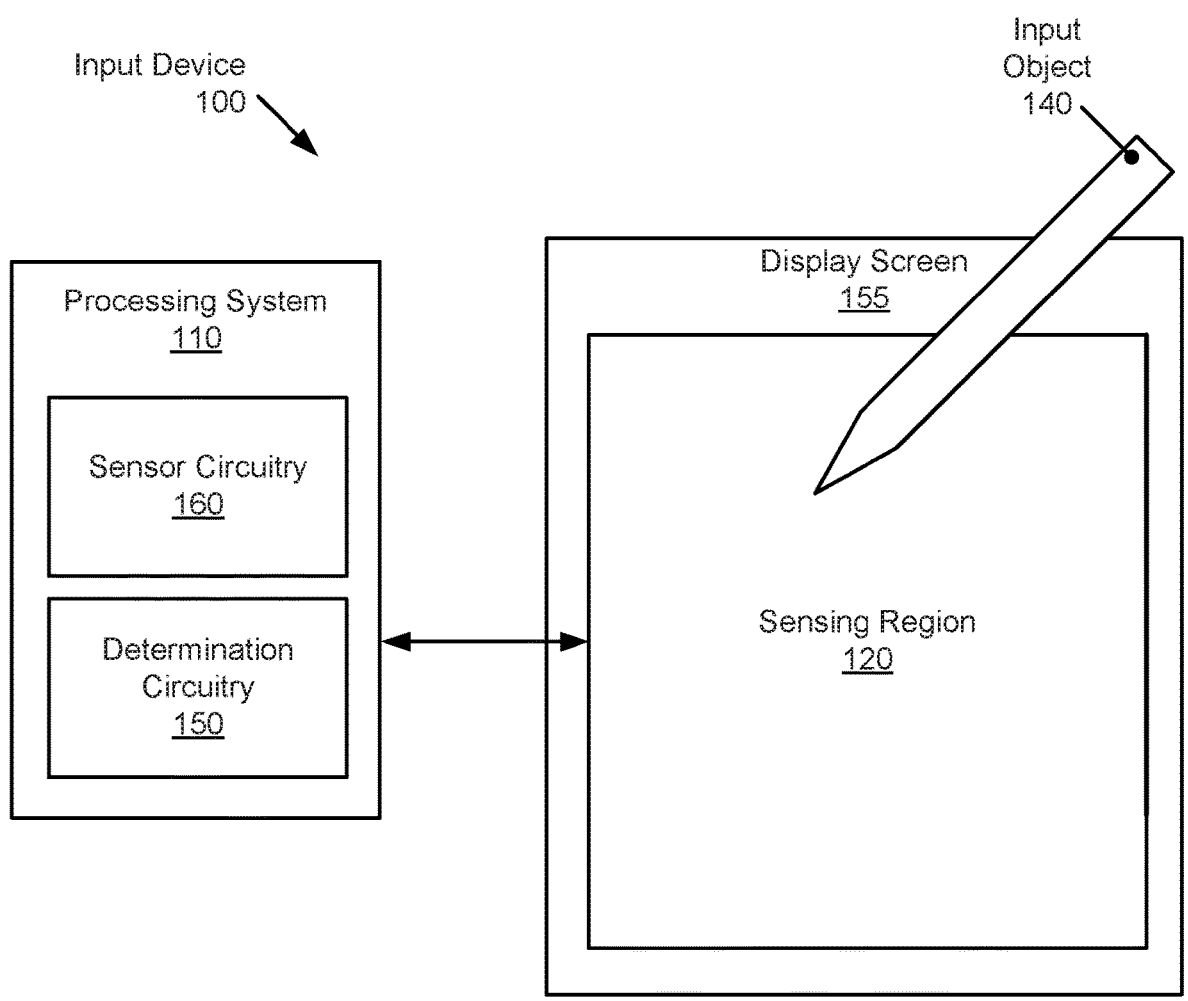
FIG. 1 shows a block diagram of an input device, in accordance with one or more embodiments.

The following detailed description is merely exemplary in nature, and is not intended to limit the disclosed technology or the application and uses of the disclosed technology. Furthermore, there is no intention to be bound by any expressed or implied theory presented in the preceding technical field, background, or the following detailed description.

In the following detailed description of embodiments, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments of the present disclosure provide input devices and methods that enable a capacitive sensing in presence of a noise emission. More specifically, embodiments of the disclosure suppress short term noise, such as noise emissions that occur in short bursts with a duration of a few milliseconds (ms) or less. The short term noise may be emitted at various frequencies. An example of such a noise emission is the noise emitted by battery chargers. Because the noise may be emitted at various rapidly alternating frequencies, frequency hopping may not be a feasible approach to avoid the noise emission.

In one or more embodiments, a repetitive multi-burst pattern is used as a capacitive sensing signal to address the noise emission. Each burst in the multi-burst pattern includes a sensing waveform, described below. Each burst in the repetitive multi-burst pattern may be emitted twice. Because the duration of the noise emission is short, with a proper configuration of the repetitive multi-burst pattern, a segment of the received response associated with one of the two bursts should not be affected by the noise emission, even though a segment of the resulting signal associated with the other of the two bursts may be affected by the noise emission. Embodiments of the disclosure subsequently identify the clean segment of the response to perform a touch decoding. A clean segment is a segment that is determined to not be affected by the noise emission. Each of these aspects is discussed in detail below.

FIG. 1 is a block diagram of an example of an input device (100), in accordance with one or more embodiments. The input device (100) may be configured to provide input to an electronic system (not shown). As used in this document, the term "electronic system" (or "electronic device") broadly refers to any system capable of electronically processing information. Some non-limiting examples of electronic systems include personal computers, such as desktop computers, laptop computers, netbook computers, tablets, web browsers, e-book readers, smart phones, personal digital assistants (PDAs), gaming devices, automotive infotainment systems, etc.

In FIG. 1, the input device (100) is shown as a proximity sensor device (e.g., "touchpad" or a "touch sensor device") configured to sense input provided by one or more input objects (140) in a sensing region (120). Example input objects include styli, an active pen, and fingers. Further, which particular input objects are in the sensing region may change over the course of one or more gestures.

The sensing region (120) encompasses any space above, around, in and/or near the input device (100) in which the input device (100) is able to detect user input (e.g., user input provided by one or more input objects). The sizes, shapes, and locations of particular sensing regions may vary widely from embodiment to embodiment.

The input device (100) may utilize any combination of sensor components and sensing technologies to detect user input in the sensing region (120). The input device (100) includes one or more sensing elements for detecting user input. As a non-limiting example, the input device (100) may use capacitive techniques.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitance sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may be a substantially constant voltage or a varying voltage and, in various embodiments, the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter", Tx) and one or more receiver sensor electrodes (also "receiver electrodes" or "receiver", Rx). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and in various embodiments, the reference voltage may be system ground. A resulting signal may include effect(s) corresponding to one or more transmitter signals, and/or to one or more sources of environmental interference (e.g., other electromagnetic signals, including noise emissions). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

In FIG. 1, a processing system (110) is shown as part of the input device (100). The processing system (110) is configured to operate the hardware of the input device (100) to detect input in the sensing region (120). The processing system (110) includes parts of or all of one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system (110) also includes electronically-readable instructions, such as firmware code, software code, and/or the like.

The processing system (110) may be implemented as a set of modules that handle different functions of the processing system (110). For example, the processing system (110) may include determination circuitry (150) to determine when at least one input object is in a sensing region, determine signal to noise ratio, determine positional information of an input object, identify a gesture, determine an action to perform based on the gesture, a combination of gestures or other information, and/or perform other operations. The modules may include hardware and/or software which may execute on a processor.

The sensor circuitry (160) may include functionality to drive the sensing elements to transmit transmitter signals and receive the resulting signals. For example, the sensor circuitry (160) may include sensory circuitry that is coupled to the sensing elements. The sensor circuitry (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals.

Although FIG. 1 shows determination circuitry (150) and a sensor circuitry (160), alternative or additional modules may exist in accordance with one or more embodiments. Example alternative or additional modules include hardware operation modules for operating hardware such as sensor electrodes and display screens (155), data processing modules for processing data such as sensor signals and positional information, reporting modules for reporting information, and identification modules configured to identify gestures, such as mode changing gestures, and mode changing modules for changing operation modes.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g., to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

While FIG. 1 shows a configuration of components, other configurations may be used without departing from the scope of the invention. For example, various components may be combined to create a single component. As another example, the functionality performed by a single component may be performed by two or more components.

Figure 2:
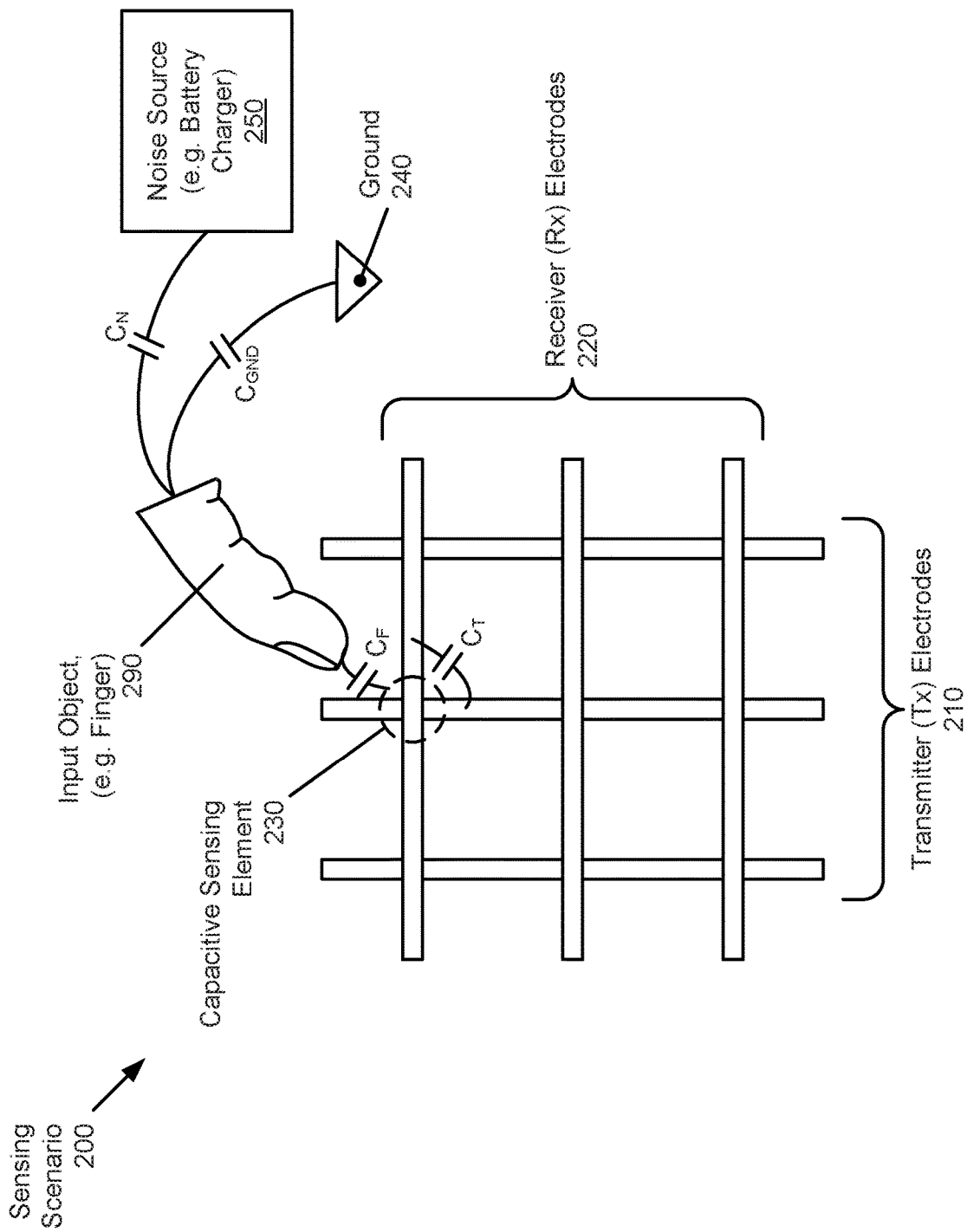
FIG. 2 shows a sensing scenario, in accordance with one or more embodiments.

FIG. 2 shows a sensing scenario (200) in accordance with one or more embodiments. In FIG. 2, a set of transmitter (Tx) electrodes (210), and a set of receiver (Rx) electrodes (220) are shown. The Tx electrodes and the Rx electrodes are intersecting at capacitive sensing elements, forming a capacitive sensing element (230), in a rectangular pattern. In the example of FIG. 2, the capacitive sensing elements (230) are arranged in a rectangular grid. Those skilled in the art will appreciate that the disclosure is not limited to a particular electrode pattern. Any electrode configuration suitable for capacitive sensing may be used. For example, the electrode configuration may be provided by a matrix pad sensor with numerous sensing pads and traces connecting to the sensing pads in a metal mesh layer across the sensing region.

Transcapacitive couplings, Cr, exist at the capacitive sensing elements (230). In one or more embodiments, the capacitive sensing elements (230) are "scanned" to determine the transcapacitive couplings. Assume, for example, a configuration with 20 Tx electrodes and 40 Rx electrodes. Each of the 20 Tx electrodes may emit a capacitive sensing signal in the form of a repetitive multi-burst pattern, and each of the 40 Rx electrodes may receive resulting signals associated with each of the emitted repetitive multi-burst patterns. The resulting signals may be used to determine measurements of the transcapacitive couplings at the capacitive sensing elements (230), which are used to determine whether an input object is present and its positional information, as discussed above. A set of values for the capacitive sensing elements (230) form a "capacitive image" (also "sensing image") representative of the transcapacitive couplings at the sensing elements. In one or more embodiments, the sensing image, or capacitive image, includes data received during a process of measuring the resulting signals received with at least a portion of the capacitive sensing elements (230) distributed across the sensing region (120). The resulting signals may be received at one instant in time, or by scanning the rows and/or columns of capacitive sensing elements (230) distributed across the sensing region (120) in a raster scanning pattern (e.g., serially polling each sensing element separately in a desired scanning pattern), row-by-row scanning pattern, column-by-column scanning pattern or other useful scanning technique.

When an input object (290), e.g., a finger, approaches a capacitive sensing element (230), $C_T$ may change by an amount $\Delta C_T$, based on the input object (290) providing a ground that alters $C_T$. In other words, $C_T$ may be sensitive to a finger-to-ground voltage, which may result from another capacitive coupling $C_{GND}$ of the finger (290) to the ground (240). $\Delta C_T$ may be measured by sensing the charges shifting to/from the Rx electrodes, in response to the driving of the Tx electrodes.

In real-world scenarios, the finger (290) is capacitively coupled, via $C_F$, not only to the ground (240), but also to noise sources (250), via $C_N$. A noise source (250) may be, for example, a battery charger, or a power supply, which may have unique noise emission characteristics, as illustrated with reference to FIG. 3. Accordingly, when the finger (290) is in proximity to the capacitive sensing element (230), the measurement of $\Delta C_T$ is affected not only by the ground, but also by noise emitted by the noise source (250), which also may cause charges to shift to/from the Rx electrodes. The ability to sense the presence or absence of the finger (290) in proximity to the capacitive sensing element (230) may, thus, be impaired by the noise emission. Various methods, discussed below, may be used to address the noise emission. For simplicity, the following discussion refers to operations performed on a single capacitive sensing element (230). The same technique may be applied to any number of capacitive sensing elements (230) in a sensing image. Further, while the operations are described within the context of a transcapacitance sensing, similar operations may be performed in an absolute capacitance scenario as discussed with reference to FIG. 1.

FIG. 3 shows an example noise emission pattern, in accordance with one or more embodiments. The noise emission pattern (300) may be associated with a noise source such as a battery charger. The battery charger (or any other noise source) may be internal to or external to an electronic device equipped with the input device. For example, the battery charger may be a USB-connectable charger.

The example noise emission pattern (300) includes 24 different emissions at discrete frequencies (shown in kHz). Each of the emissions may have a certain amplitude (shown in V, peak-to-peak). Higher amplitudes may cause more interference. Each of the emissions at the discrete frequencies may occur for a limited time. In the example noise emission pattern (300), each emission may occur for approximately 0.5 ms. In other noise emission patterns, the noise emissions may have different durations, without departing from the disclosure. The noise emission pattern may repeat over time, cycling through the frequencies as shown.

Interference with the capacitive sensing performed by the input device may occur when the frequency of the emitted noise coincides with, or is close to, the frequency of the signal used for driving the Tx electrodes. The signal used for driving the Tx electrodes (the "sensing signal") may be an alternating current (AC) signal, for example, a square wave. Multiple cycles of the square wave may be grouped in a burst, and multiple bursts may be grouped in a burst pattern or a repetitive burst pattern. Various frequencies may be used for driving the Tx electrodes, for example, in a range between 100 and 250 kHz. In the example of the noise emission pattern (300), the frequencies that may be used for sensing overlap with frequencies of the noise emission pattern, thus potentially causing interference with the capacitive sensing.

Figure 4A:
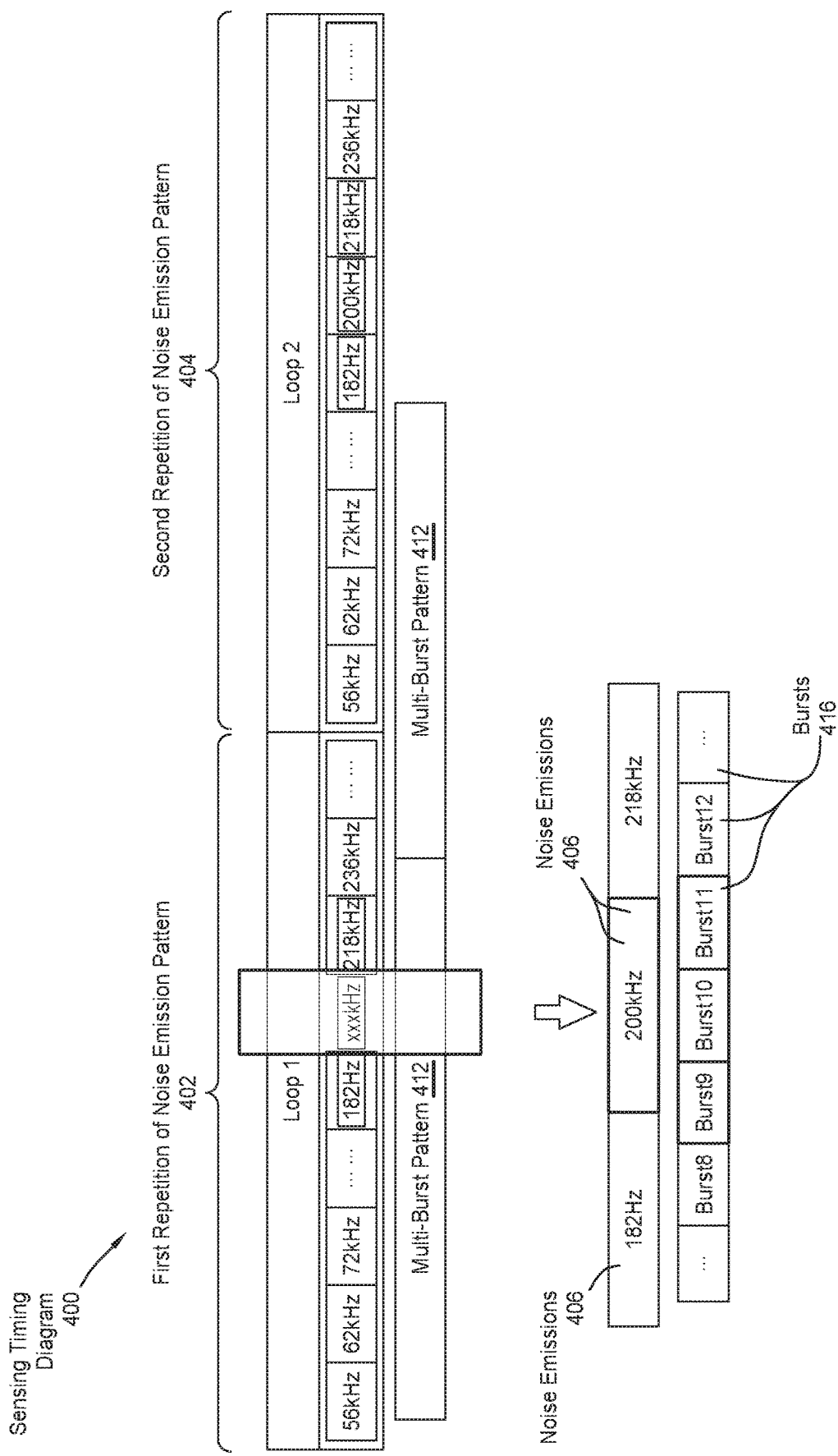
FIG. 4A shows a sensing timing diagram.

FIG. 4A shows an example sensing timing diagram illustrating how noise emissions may affect the received signals. In the sensing timing diagram (400), the signal used for driving the Tx electrodes temporally overlaps with noise emissions (406).

The sensing signal includes a multi-burst pattern (412). Multi-burst patterns (412) may be sequentially emitted when a sensing is continuously performed. The multi-burst pattern includes a series of bursts (416). The combination of all bursts (416) in a multi-burst pattern may provide the capacitive sensing signal to be used for a single capacitive sensing operation, e.g., using a code-division multiplexing (CDM) encoding. For example, 18 bursts may be used for a CDM encoding with the order of 18. When picked up by an Rx electrode at a capacitive sensing element, a resulting signal may be decoded using a CDM demodulation.

With $C_T$ being altered by the presence or absence of an input object, the resulting signal may be affected by the presence or absence of the input object. Accordingly, the resulting signal allows for a detection of the presence or absence of the input object. However, if a noise emission is overlapping one or more of the bursts, the resulting signal may get corrupted by the noise emission.

Each of the bursts (416) includes a number of cycles of a signal, e.g., a square wave. In one example, assume that the signal has a frequency of 170 kHz. Accordingly, a single cycle has a duration of ~6 μs. Each burst may include 40 cycles, resulting in a burst duration of ~240 μs. A burst pattern with 18 bursts may, thus, have a duration of ~4.32 ms. In another example, assume that the signal has a frequency of 204 kHz. Accordingly, a single cycle has a duration of ~5 μs. Each burst may include 50 cycles, resulting in a burst duration of ~250 μs. A multi-burst pattern with 18 bursts may, thus, have a duration of ~4.5 ms.

As previously noted, and as illustrated in FIG. 4A, the noise emission may temporally overlap with the burst patterns. In the example, a first and a second repetition (402, 404), of a noise emission pattern are shown. The noise emission pattern corresponds to the noise emission pattern shown in FIG. 3. Accordingly, each of the noise emission patterns (402, 404) includes noise emissions (406) at the frequencies shown in FIG. 3. Each noise emission (406) lasts for 0.5 ms. Based on the above example of bursts (416) having a duration of ~240 μs or ~250 μs, a noise emission may thus overlap with two or three bursts (416) (as shown, bursts 9, 10, and 11 are affected). In the example shown in FIG. 4A, one of the noise emissions (406) is at 200 kHz. Assuming a sensing signal at 204 kHz, the 200 kHz noise emission is likely to affect any sensing performed with bursts 9, 10, and 11, due to the overlap. Because the demodulation to obtain the result signal relies on the combination of bursts 1-18, the resulting signal is likely to be corrupted by the noise emission. While other noise emissions are also present in the example (at 182 kHz, 218 kHz) these other noise emissions are sufficiently remote from the sensing signal at 204 kHz, therefore being unlikely to cause interference.

Figure 4B:
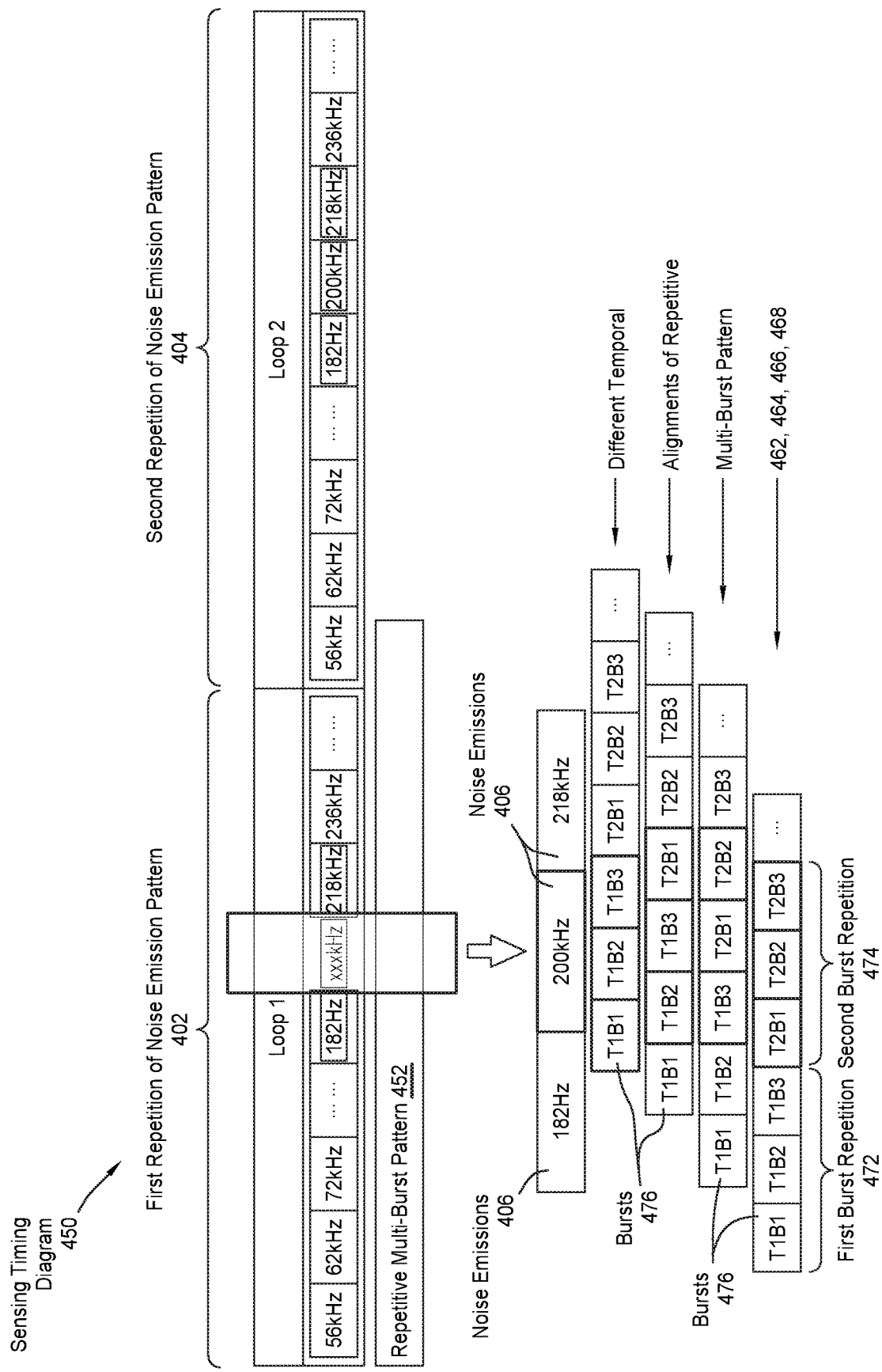
FIG. 4B shows a sensing timing diagram, in accordance with one or more embodiments.

FIG. 4B shows an example sensing timing diagram in accordance with one or more embodiments. In the sensing timing diagram (450), the sensing signal temporally overlaps with noise emissions, analogous to the scenario illustrated in FIG. 4A. Also analogous to FIG. 4A, a repeating noise emission pattern with a first and a second repetition (402, 404) are shown.

Unlike in FIG. 4A, the sensing signal is a repetitive multi-burst pattern (452). In the repetitive multi-burst pattern (452), the bursts (476), within the repetitive multi-burst pattern, repeat. In one or more embodiments, bursts and repetitions of the bursts are interleaved. Specifically, in the example of FIG. 4B, the 18 bursts repeat in groups of three. The bursts (476) are labeled T1B1, T1B2, T1B3, . . . T1B18 for the first repetition of the 18 bursts, and T2B1, T2B2, T2B3, . . . T2B18 for the second repetition of the 18 bursts. A total of 36 bursts, thus, forms the repetitive multi-burst pattern (452). Based on the organization of the bursts (476) in groups of three, the bursts are in the order T1B1, T1B2, T1B3, T2B1, T2B2, T2B3, T1B4, T1B5, T1B6, T2B4, T2B5, T2B6, . . . T1B16, T1B17, T1B18, T2B16, T2B17, T2B18, in one repetitive multi-burst pattern (452).

In FIG. 4B, four different temporal alignments of the repetitive multi-burst pattern (462, 464, 466, 468) are shown. Because a 204 kHz sensing signal is used, the bursts (476) that temporally overlap with the 200 kHz noise emission (406) are affected by the noise emission. Any sensing signal at a particular frequency may be affected by a noise emission if the frequency of the noise emission is substantially identical to the frequency of the sensing signal (within a few kHz, e.g., 1, 2, 3, 4, or 5 kHz). Depending on the temporal alignment, the affected burst may be a different one. For example, in the first temporal alignment of the repetitive multi-burst pattern (462), the bursts T1B1, T1B2, T1B3 are affected. In the second temporal alignment of the repetitive burst pattern (464), the bursts T1B2, T1B3, T2B1 are affected. As illustrated in FIG. 4B, regardless of the temporal alignment, there are always three bursts in the example that are affected by the example noise emission. Which ones of the bursts are affected by the example noise emission may change, though.

In one or more embodiments, because the 18 bursts in the repetitive multi-burst pattern repeat in groups of three, it is likely that, while some bursts may be affected by the noise emission, there is a repetition that is unaffected for each of the affected bursts. Consider the first temporal alignment of the repetitive multi-burst pattern (462), in which the bursts T1B1, T1B2, T1B3 are affected. In this case, the bursts T2B1, T2B2, and T2B3 are unaffected. Similarly, consider the second temporal alignment of the repetitive burst pattern (464), in which the bursts T1B2, T1B3, T2B1 are affected. In this case, the bursts T1B1, T1B2, T1B3 are unaffected.

While the repetitive multi-burst pattern (462) is discussed as having bursts that repeat in groups of three, in other embodiments, single bursts may repeat, bursts may repeat in groups of two, four, etc. The selected repetition pattern, in one or more embodiments, depends on the duration of the noise emission (406) relative to the duration of a single burst. If the noise emission (406) affects no more than one burst, single bursts may repeat. If the noise emission (406) affects no more than two bursts, bursts may repeat in groups of two. If the noise emission (406) affects no more than four bursts, bursts may repeat in groups of four. Generally speaking, a subset of consecutive bursts may have a cardinality that is based on the duration of the noise emission. The cardinality is selected to allow for the minimum number of consecutive bursts needed to obtain a joint duration (of the subset of consecutive bursts) that exceeds the duration of the noise emission. The subset of consecutive bursts may be followed by a subset of corresponding repeated bursts.

In this manner, it is likely that for one burst that is affected by the noise emission, there is a repetition of the burst that is unaffected by the noise emission. A touch may, thus, be decoded, by selecting bursts that are unaffected by the noise emission, over bursts that are affected by the noise emissions. Additional details regarding the selection of a suitable repetitive multi-burst pattern, the application of the repetitive multi-burst pattern, and the decoding of touch are provided below with reference to the flowcharts.

Figure 5:
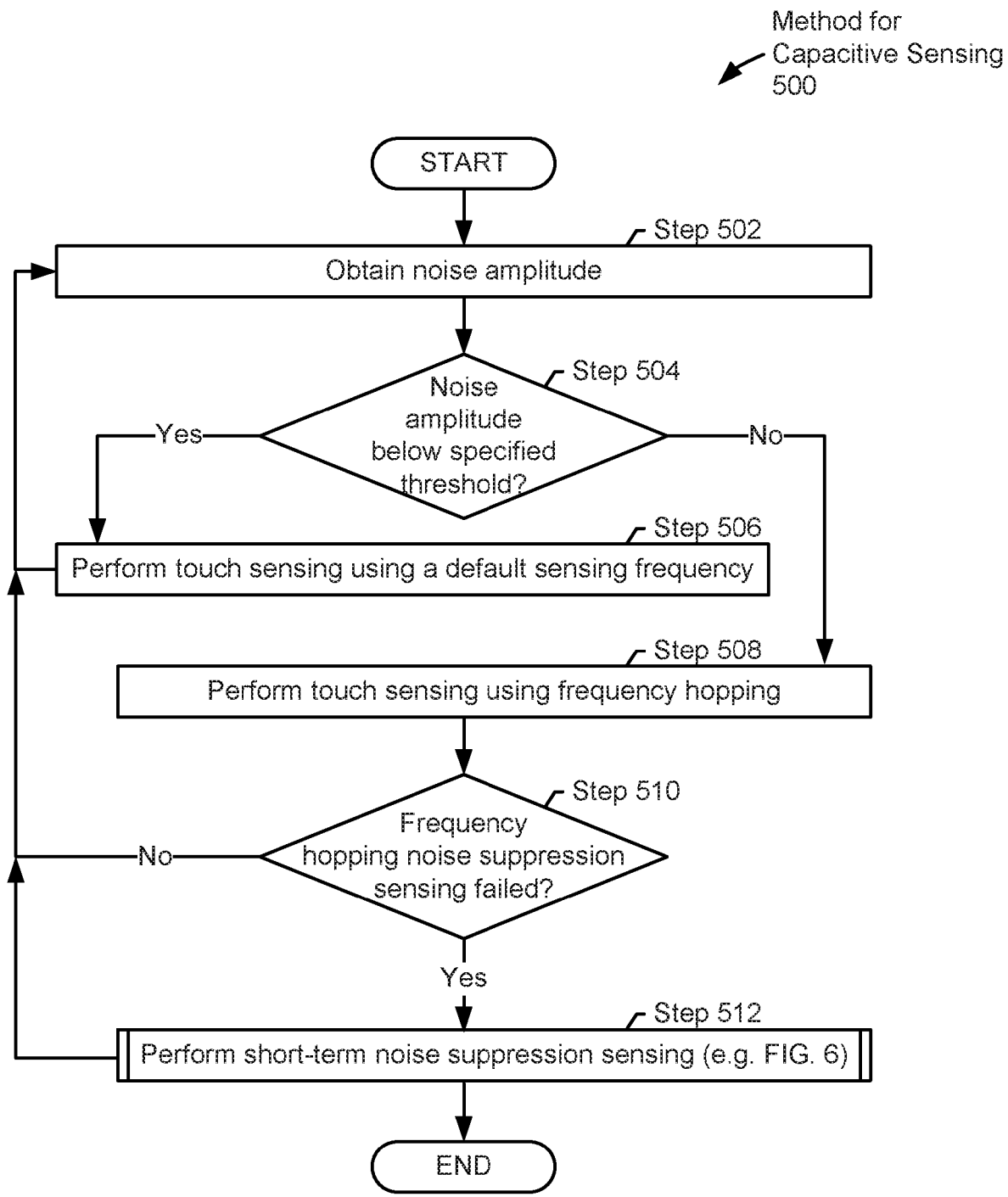
FIG. 5 shows a flowchart describing a method for capacitive sensing, in accordance with one or more embodiments.
Figure 6:
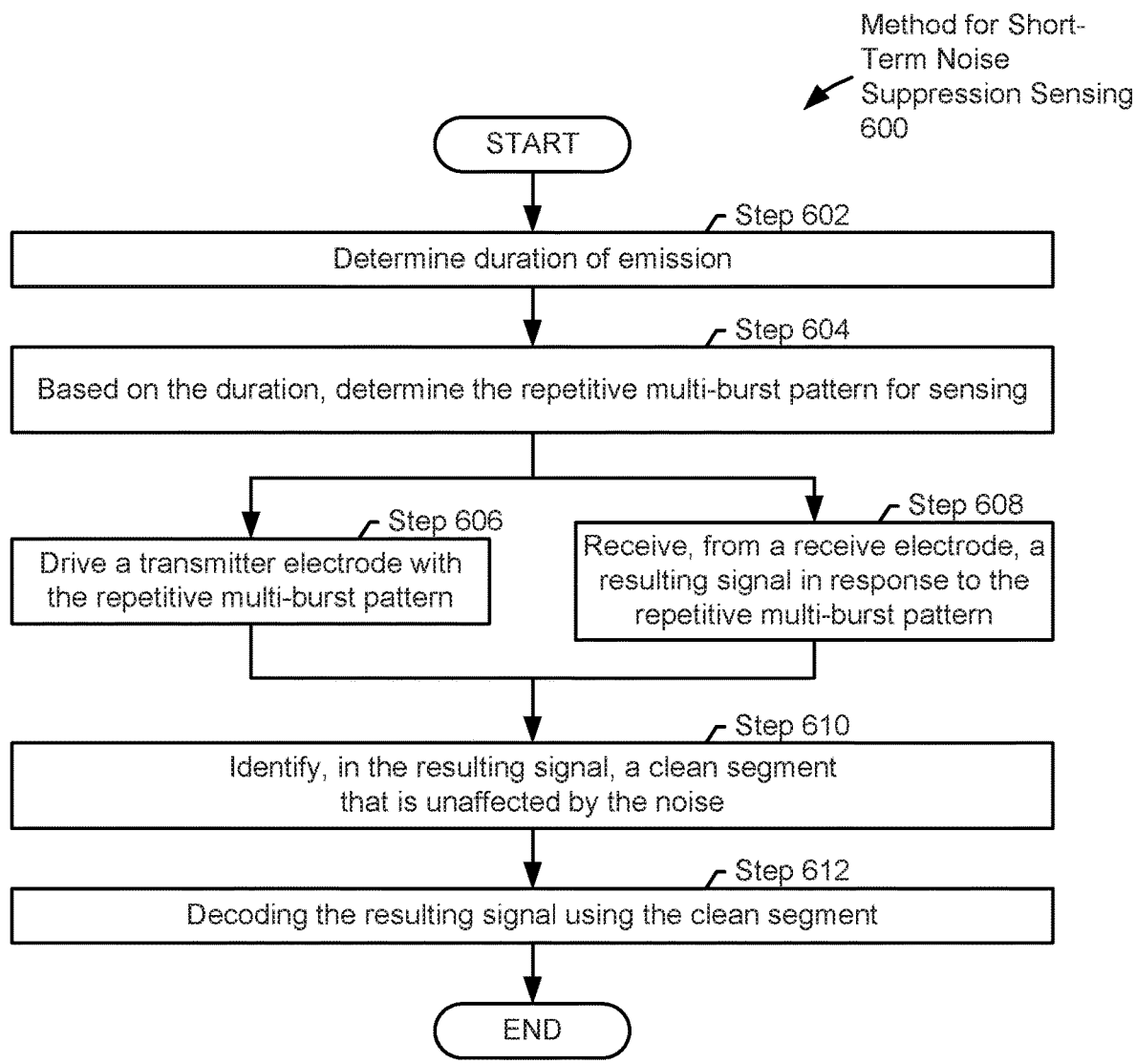
FIG. 6 shows a flowchart describing a method for short-term noise suppression sensing, in accordance with one or more embodiments.

FIG. 5 and FIG. 6 show flowcharts in accordance with one or more embodiments. While the various steps in the flowcharts are presented and described sequentially, one of ordinary skill will appreciate that some or all of the steps may be executed in different orders, may be combined or omitted, and some or all of the steps may be executed in parallel. Additional steps may further be performed. Accordingly, the scope of the disclosure should not be considered limited to the specific arrangement of steps shown in FIG. 5 and FIG. 6.

While the steps of the described methods are discussed with reference to one capacitive sensing element, those skilled in the art will appreciate that at least some of the steps may be repeated for multiple or all capacitive sensing elements in a sensing region to obtain a capacitive image.

FIG. 5 shows a flowchart describing a method for capacitive sensing, in accordance with one or more embodiments. The method may be repeatedly executed, e.g., in a loop at a fixed rate to provide periodically updated touch outputs.

In Step 502, a noise amplitude of the noise emission is obtained. Obtaining the noise amplitude may involve emitting a noise sensing burst to measure the interference caused by the noise emission. The measurement of the noise emission may be performed using electrodes located in the sensing region. In one or more embodiments, the noise sensing burst includes a signal similar to the signal intended to be used for the touch sensing. For example, if the touch sensing is to be performed at 204 kHz, the signal for the noise sensing burst is also at 204 kHz. Different numbers of noise sensing bursts may be emitted in Step 502. For example, when the system performs a touch sensing using a default sensing frequency (as described in Step 506), or when the system performs a touch sensing using frequency hopping (as described in Step 508), only a few, e.g., 1, 2, 3, or 4 noise sensing bursts are emitted to determine the noise amplitude. The use of only a few noise sensing bursts may be adequate when noise is present for a prolonged interval, for which the use of a default sensing frequency approach (Step 506) or a frequency hopping approach (Step 508) may be appropriate. However, when the system is required to perform short-term noise suppression sensing (as described in Step 512), more noise sensing bursts, e.g., 20 noise sensing bursts may be emitted in Step 502. When a sufficient number of noise sensing bursts (e.g., 20 noise sensing bursts) are emitted, the duration of the noise emission may also be determined, in addition to the amplitude, as described below in reference to FIG. 6.

In Step 504, a test is performed to determine whether the noise amplitude is above or below a specified threshold. If the noise amplitude is below the specified threshold, the execution of the method may proceed with Step 506. If the noise amplitude reaches or exceeds the specified threshold, the execution of the method may proceed with Step 508.

In Step 506, a touch sensing is performed using a default sensing frequency and a multi-burst pattern. The multi-burst pattern may be as described in FIG. 4A. Referring to the previously discussed example, a sensing at a capacitive sensing element may be performed at an assumed default frequency of, for example, 204 kHz (cycle period ~5 μs), a burst size of 50, and a resulting burst duration of ~250 μs. With 18 bursts used for the CDM scheme, the duration of the transcapacitive sensing at the capacitive sensing element may be performed in ~4.5 ms. A low-pass filter and a demodulator circuit may produce a resulting signal indicative of touch, while eliminating or reducing noise interference that is not in direct proximity (e.g., within a few kHz) of the default frequency used for the sensing. The output of Step 506 may be used as the result of the touch sensing, indicating a presence or absence of touch, and after completion of Step 506, the execution of the method may return to Step 502, to continue with the next sensing cycle.

In Step 508, a touch sensing is performed using a frequency hopping approach. In the frequency hopping approach, a sensing frequency may be chosen from a set of possible sensing frequencies, for example, in the range of 100-250 kHz. The frequency to be used may be chosen to avoid the frequency of the noise emission. Assume, for example, that the frequency hopping approach provides two sensing frequencies: 204 kHz and 170 kHz. If the frequency of the noise emission is found to be at 200 kHz, the frequency hopping approach would use the 170 kHz sensing frequency. Specifically, in the example, Step 502 may first be performed for the 204 kHz sensing frequency. In Step 504 it is determined that the noise amplitude exceeds the specified threshold, and as a result, the 170 kHz sensing frequency is selected to repeat Steps 502-508. The frequency hopping may be performed for any number of available sensing frequencies, e.g., until an appropriate sensing frequency is found. The used multi-burst pattern may be non-repetitive. Referring to the previously discussed example, a sensing at a capacitive sensing element may be performed at 170 kHz (cycle period ~6 μs), a burst size of 40, and a resulting burst duration of ~240 μs. With 18 bursts used for the CDM scheme, the duration of the transcapacitive sensing at the capacitive sensing element may be performed in ~4.3 ms. A low-pass filter and a demodulator circuit may produce a resulting signal indicative of touch, while eliminating or reducing noise interference that is not in direct proximity (e.g., within a few kHz) of the default frequency used for the sensing.

In Step 510, a test is performed to determine whether the frequency hopping approach of Step 508 succeeded or failed. The frequency hopping approach may be determined to have failed, if all available sensing frequencies have been tested (through repeated execution of Steps 502-508) without producing a noise amplitude below the specified threshold. If the frequency hopping approach is found to have failed, the method may proceed with the execution of Step 512. If the frequency hopping approach is found to have succeeded, the output of Step 508 may be used as the result of the touch sensing, indicating a presence or absence of touch, and the execution of the method may return to Step 502, to continue with the next sensing cycle.

In Step 512, a touch sensing is performed using a short-term noise suppression sensing, as further described below with reference to FIG. 6. Briefly summarized, a repetitive multi-burst pattern may be used for the sensing. In the repetitive multi-burst pattern, each of the bursts may occur twice. Among two of the same bursts, the burst that is less affected by the noise emission may subsequently be selected for further processing to determine presence or absence of a touch. The output of Step 512 may be used as the result of the touch sensing, indicating a presence or absence of touch, and after completion of Step 512, the execution of the method may return to Step 502, to continue with the next sensing cycle.

FIG. 6 shows a flowchart describing a method for short-term noise suppression sensing, in accordance with one or more embodiments. The method of FIG. 6, when executed, may allow a decoding of touch in presence of noise emissions as discussed with reference to FIG. 4B. The method of FIG. 6 may be performed for a particular sensing frequency, e.g., the default sensing frequency. In such a scenario, all bursts of the repetitive multi-burst pattern used for the sensing are emitted at the default sensing frequency. The method of FIG. 6 may alternatively be performed at any other sensing frequency, e.g., if the execution at the default sensing frequency does not result in in a successful decoding of touch. In such a scenario, the bursts of the repetitive multi-burst pattern used for the sensing are emitted at the selected sensing frequency. The method of FIG. 6 may alternatively be performed using multiple sensing frequencies. In such a scenario, one or more bursts of the repetitive multi-burst pattern are emitted at a first selected sensing frequency, and one or more bursts of the repetitive multi-burst pattern are emitted at a second selected sensing frequency. Any number of sensing frequencies may be used, in this scenario. The choice of the sensing frequency/frequencies may depend on the frequencies known to be present/ absent in the noise emissions. The selection of sensing frequencies that are different from the frequencies of the noise emissions, where possible, may improve the robustness of the touch sensing.

In Step 602, the duration of the noise emission is determined. The duration of the noise emission may be determined based on the noise measurement performed in Step 502. The duration may be a measured time interval during which the amplitude exceeds a previously specified threshold, at frequencies in proximity to the sensing frequency.

In Step 604, based on the duration of the noise emission, a repetitive multi-burst pattern is defined. In one or more embodiments, the arrangement of the repetitive bursts in the repetitive multi-burst pattern depends on the duration of the bursts and the duration of the noise emission. In one or more embodiments, bursts and repetitions of the bursts are interleaved. Specifically, as discussed with reference to FIG. 4B, the repetitive bursts are arranged such that in case of one burst being affected by the noise emission, it is likely that the repetition of the same burst is unaffected by the noise emission. For example, if the noise emission has a duration that is sufficient to affect up to three consecutive bursts, the repetitive burst pattern includes bursts that repeat in groups of three, as illustrated in FIG. 4B.

In Step 606, the repetitive multi-burst pattern is emitted on a Tx electrode.

In Step 608, concurrently with the execution of Step 606, a resulting signal in response to the emitted repetitive multi-burst pattern is received on a Rx electrode. The resulting signal may include the repetitive multi-burst pattern, modulated by the presence or absence of an input object, and/or by noise emissions that occur during the receiving of the resulting signal.

In Step 610, in the resulting signal obtained in Step 608, clean segments with bursts that are unaffected by the noise emission are identified. The clean segment is a segment unaffected by the noise emission. Referring to FIG. 4B, when using the repetitive multi-burst pattern for the sensing, there may be bursts that are affected by the noise emission. However, because each of the bursts in the pattern occurs twice, each burst that is affected by the noise emission has a matching burst that is unaffected by the noise emission. Accordingly, in the resulting signal, a clean segment may be identified. The clean segment is determined to be unaffected or least affected by the noise emission, and temporally coincides with either the a burst or the repetition of the burst.

A previously received resulting signal (e.g., from the previous execution of the method of FIG. 5), may be used as a reference to determine, for two matching bursts (the burst and the repetition of the burst), the burst that is affected by the noise emission, vs the burst that is unaffected by the noise emission. From the previous execution of the method of FIG. 5, a burst that is unaffected by the noise emission is known. To make this determination, a comparison of the current resulting signal with the previous resulting signal may thus be performed. More specifically, in the resulting signal, the two segments with the two matching bursts are compared to a segment with the burst free of the noise emission in the previous resulting signal, to determine which one of the segments associated with the two burst is more similar to the segment of the previous resulting signal which is assumed to be free of the noise emission. The segment that is more similar to the segment of the previous resulting signal may be considered the clean segment.

Consider, for example, a resulting signal that includes the repetitive multi-burst pattern (452) in FIG. 4B. In the example of the first alignment (462), the segment of the resulting signal associated with T2B1, T2B2, and T2B3 would be chosen over the segment associated with T1B1, T1B2, and T1B3. In the example of the second alignment (464), the segment of the resulting signal associated with T1B1, T2B2, and T2B3 would be chosen over the segment associated with T2B1, T1B2, and T1B3, etc.

In one embodiment, the comparison is performed using a minimum maximum distance operation, which may be performed as follows. When a sensing operation is performed by emitting a sensing signal on a Tx electrode, a resulting signal may be obtained by Rx electrodes at each capacitive sensing element associated with the Tx electrode. Each of these resulting signals may include the low-pass filtered non-demodulated signal, obtained from the corresponding Rx electrode. Consider, for example, the sensing scenario (200) of FIG. 2. In this example, three Rx electrodes may obtain a response to the sensing signal emitted on one Tx electrode. Each of the three obtained resulting signals may be different, e.g., depending on whether an input object is present in proximity to the corresponding capacitive sensing element or not. Further, each of the three resulting signals includes both of the repetitive bursts. To obtain the minimum maximum distance, for each of the three resulting signals, the signal amplitude of the resulting signal is obtained for the first and the second of the two bursts. Next, an absolute difference is computed for each of the signal amplitudes in comparison to the signal amplitude of the previous resulting signal, for the segment with the burst that is known not to be affected by the noise emission. Between the three resulting signals associated with the Rx electrodes, for the first burst, the maximum of the absolute difference is identified, and for the second burst the maximum of the absolute difference is identified. The two maxima may be associated with different electrodes. For example, the maximum for the first burst may be associated with the first Rx electrode, and the maximum for the second burst may be associated with the third Rx electrode. The segment of the resulting signal, associated with the lower of the two maxima is subsequently selected as the clean segment for further processing. Subsequently, despite possible corruption of part of the resulting signal, a complete resulting signal, detected as being free of noise artifacts, is assembled by selecting only clean segments. Under particular circumstances, both bursts of a pair of bursts may be overlapped by the noise emission. This may occur, for example, when the duration of the noise emission is longer than assumed when determining the repetitive multi-burst pattern in Step 604.

In Step 612, a touch is decoded from the resulting signal obtained in Step 610. The decoding of touch may involve a demodulation, in addition to the previously mentioned low-pass filtering. The demodulated resulting signal may be analog to digital (A/D) converted to enable further processing, including the detection of a presence or absence of touch. The touch decoding in Step 612 may be unsuccessful and may be skipped, if both bursts are affected by the noise emission. In this case, Step 510 of FIG. 5 may ensure that an alternative method for touch sensing is performed.

Embodiments of the disclosure may have various features. Embodiments of the disclosure may perform a touch sensing in presence of noise emissions with various characteristics, including noise that includes brief repetitive bursts at discrete frequencies. Embodiments of the disclosure may perform the touch sensing in presence of high amplitude noise. Embodiments of the disclosure do not necessitate a narrow band-pass filtering, which would increase the burst cycles. Embodiments of the disclosure do not necessitate an increase of the sensing signal amplitude, which would increase power consumption and could cause interference with other components, e.g., a display.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A processing system configured to:
    drive a transmitter electrode with a repetitive multi-burst pattern, wherein the repetitive multi-burst pattern comprises:
        a first plurality of bursts of a sensing waveform, and
        a second plurality of bursts of the sensing waveform, wherein the second plurality of bursts is a repetition of the first plurality of bursts;
    receive, from a receiver electrode, a resulting signal in response to the repetitive multi-burst pattern,
    identify, in the resulting signal, a segment least affected by a noise, and that temporally coincides with a burst in the first plurality of bursts or a burst in the second plurality of bursts matching the burst in the first plurality of bursts, wherein identifying the segment that is least affected by the noise comprises:
        comparing a first segment of the resulting signal and a second segment of the resulting signal to a third segment,
            wherein the first segment of the resulting signal temporally coincides with the burst in the first plurality of bursts, the second segment of the resulting signal temporally coincides with the burst in the second plurality of bursts, and the third segment is associated with a prior repetitive multi-burst pattern obtained in absence of the noise, and
        selecting, between the first segment and the second segment, the segment least affected by the noise that is more similar to the third segment; and
    decode the resulting signal using the segment.

2. The processing system of claim 1, wherein selecting, between the first segment and the second segment, the segment least affected by the noise comprises performing a minimum maximum distance operation on amplitudes of the first segment, the second segment, and the third segment.

3. The processing system of claim 1, wherein the second plurality of bursts is interleaved with the first plurality of bursts.

4. The processing system of claim 3, wherein the second plurality of bursts interleaved with the first plurality of bursts comprise:
    a first subset of consecutive bursts selected from the first plurality of bursts, wherein the first subset has a cardinality that is based on a duration of the noise; and
    a second subset of consecutive bursts selected from the second plurality of bursts, and corresponding to the first subset of consecutive bursts, wherein the second subset has the cardinality.

5. The processing system of claim 4, wherein the cardinality is selected to be the minimum cardinality necessary for a joint duration of the first subset of consecutive bursts to exceed the duration of the noise.

6. The processing system of claim 4, wherein the duration of the noise is determined based on noise measurements performed using a plurality of noise sensing bursts emitted on the transmitter electrode.

7. The processing system of claim 1,
    wherein a frequency of the noise is substantially identical to a frequency of the sensing waveform.

8. The processing system of claim 1,
    wherein the sensing waveform of different bursts of the first plurality of bursts has a different frequency amongst the different bursts.

9. The processing system of claim 1, wherein decoding the resulting signal comprises a code-division multiplexing (CDM) decoding of the resulting signal.

10. An input device comprising:
    a transmitter electrode and a receiver electrode; and
    a processing system configured to:
        drive the transmitter electrode with a repetitive multi-burst pattern, wherein the repetitive multi-burst pattern comprises:
            a first plurality of bursts of a sensing waveform, and
            a second plurality of bursts of the sensing waveform, wherein the second plurality of bursts is a repetition of the first plurality of bursts;
        receive, from the receiver electrode, a resulting signal in response to the repetitive multi-burst pattern, identify, in the resulting signal, a segment least affected by noise, and that temporally coincides with a burst in the first plurality of bursts or a burst in the second plurality of bursts matching the burst in the first plurality of bursts,
wherein identifying the segment that is least affected by the noise comprises:
comparing a first segment of the resulting signal and a second segment of the resulting signal to a third segment,
wherein the first segment of the resulting signal temporally coincides with the burst in the first plurality of bursts, the second segment of the resulting signal temporally coincides with the burst in the second plurality of bursts, and the third segment is associated with a prior repetitive multi-burst pattern obtained in absence of the noise; and
selecting, between the first segment and the second segment, the segment least affected by the noise that is more similar to the third segment; and
decode the resulting signal using the segment.

11. The input device of claim 10, wherein the noise is coupled onto the resulting signal by an input object proximate to a capacitive sensing element formed by the transmitter electrode and the receive electrode.

12. The input device of claim 10, further comprising a battery charger, wherein the battery charger is a noise source associated with the noise.

13. The input device of claim 10, wherein a frequency of the noise is substantially identical to a frequency of the sensing waveform.

14. A method for operating an input device, the method comprising:
driving a transmitter electrode with a repetitive multi-burst pattern, wherein the repetitive multi-burst pattern comprises:
a first plurality of bursts of a sensing waveform, and
a second plurality of bursts of the sensing waveform, wherein the second plurality of bursts is a repetition of the first plurality of bursts;
receiving, from a receiver electrode, a resulting signal in response to the repetitive multi-burst pattern,
identifying, in the resulting signal, a segment least affected by a noise, and that temporally coincides with a burst in the first plurality of bursts or a burst in the second plurality of bursts matching the burst in the first plurality of bursts, wherein identifying the segment that is least affected by the noise comprises:
comparing a first segment of the resulting signal and a second segment of the resulting signal to a third segment,
wherein the first segment of the resulting signal temporally coincides with the burst in the first plurality of bursts, the second segment of the resulting signal temporally coincides with the burst in the second plurality of bursts, and the third segment is associated with a prior repetitive multi-burst pattern obtained in absence of the noise, and
selecting, between the first segment and the second segment, the segment least affected by the noise that is more similar to the third segment; and
decoding the resulting signal using the segment.

15. The method of claim 14, wherein the second plurality of bursts is interleaved with the first plurality of bursts.

16. The method of claim 15, wherein the second plurality of bursts interleaved with the first plurality of bursts comprise:
a first subset of consecutive bursts selected from the first plurality of bursts, wherein the first subset has a cardinality that is based on a duration of the noise; and
a second subset of consecutive bursts selected from the second plurality of bursts, and corresponding to the first subset of consecutive bursts, wherein the second subset has the cardinality.

17. The method of claim 16, wherein the cardinality is selected to be the minimum cardinality necessary for a joint duration of the first subset of consecutive bursts to exceed the duration of the noise.

\* \* \* \* \*